(12) United States Patent
Damsohn et al.

(10) Patent No.: US 8,863,542 B2
(45) Date of Patent: Oct. 21, 2014

(54) APPARATUS FOR COOLING OF ELECTRICAL ELEMENTS

(75) Inventors: Herbert Damsohn, Aichwald (DE);
Ronald Gneiting, Nürtingen (DE);
Tobias Isermeyer, Löwenstein (DE);
Klaus Luz, Herrenberg (DE); Conrad Pfender, Besigheim (DE)

(73) Assignee: Behr GmbH & Co. KG, Stuttgart (DE)

( * ) Notice: Subject to any disclaimer, the term of this patent is extended or adjusted under 35 U.S.C. 154(b) by 1399 days.

(21) Appl. No.: 12/055,733

(22) Filed: Mar. 26, 2008

(65) Prior Publication Data

US 2009/0059528 A1 Mar. 5, 2009

(30) Foreign Application Priority Data

Sep. 3, 2007 (EP) .................................... 07017195

(51) Int. Cl.
| | |
|---|---|
| *B60H 1/32* | (2006.01) |
| *H01M 10/6568* | (2014.01) |
| *H01M 10/643* | (2014.01) |
| *H01M 10/663* | (2014.01) |
| *H01M 10/625* | (2014.01) |
| *B60H 1/00* | (2006.01) |
| *F28F 3/04* | (2006.01) |
| *H01M 10/613* | (2014.01) |
| *H01M 10/6557* | (2014.01) |
| *H01M 2/10* | (2006.01) |
| *H05K 7/20* | (2006.01) |
| *F28D 1/047* | (2006.01) |
| *F28D 1/03* | (2006.01) |
| *F28D 21/00* | (2006.01) |
| *H01M 10/0525* | (2010.01) |

(52) U.S. Cl.
CPC ......... *F28D 1/0478* (2013.01); *H01M 10/5077* (2013.01); *H01M 10/503* (2013.01); *H01M 10/5095* (2013.01); *F28F 2210/02* (2013.01); *H01M 10/5016* (2013.01); *B60H 1/00278* (2013.01); *F28D 2021/0094* (2013.01); *F28F 3/046* (2013.01); *H01M 10/5004* (2013.01); *F28D 2021/0031* (2013.01); *Y02E 60/12* (2013.01); *H01M 10/5059* (2013.01); *H01M 2/1077* (2013.01); *H05K 7/2029* (2013.01); *H01M 10/0525* (2013.01); *H05K 7/20881* (2013.01); *F28D 1/035* (2013.01); *B60H 2001/00307* (2013.01)
USPC .............................. 62/259.2; 62/239; 429/120

(58) Field of Classification Search
USPC .................... 62/239, 259.2; 429/120
See application file for complete search history.

(56) References Cited

U.S. PATENT DOCUMENTS

| | | | | |
|---|---|---|---|---|
| 4,438,809 | A | * | 3/1984 | Papis ............................ 165/166 |
| 5,268,242 | A | | 12/1993 | Morandi |

(Continued)

FOREIGN PATENT DOCUMENTS

| | | |
|---|---|---|
| DE | 43 27 895 A1 | 2/1995 |
| DE | 692 03 289 T2 | 11/1995 |

(Continued)

*Primary Examiner* — Cassey D Bauer
(74) *Attorney, Agent, or Firm* — Muncy, Geissler, Olds & Lowe, P.C.

(57) ABSTRACT

Apparatus for cooling electrical elements, comprising a heat sink (1, 101, 201) through which a coolant can flow, a plurality of electrical elements (2, 102, 202) which each have a bottom surface and a side surface, with the bottom surfaces being aligned essentially on one plane, with the heat sink (1, 101, 201) having at least one channel (4, 5, 104, 105, 204, 205) through which a coolant can flow and making thermal contact with the electrical elements (2, 102, 202), characterized in that the heat sink (1, 101, 202) extends essentially parallel to the plane of the bottom surfaces, with the channel (4, 5, 104, 105, 204, 205) in the heat sink having a profile which is matched to edges of the electrical elements (2, 102, 202).

48 Claims, 7 Drawing Sheets

(56) References Cited

U.S. PATENT DOCUMENTS

| | | | |
|---|---|---|---|
| 5,879,833 A | 3/1999 | Yoshii et al. | |
| 5,978,220 A | 11/1999 | Frey et al. | |
| 6,498,406 B1 * | 12/2002 | Høriuchi et al. | 307/150 |
| 6,512,347 B1 | 1/2003 | Hellmann et al. | |
| 6,594,149 B2 | 7/2003 | Yamada et al. | |
| 7,040,381 B2 | 5/2006 | Eisele et al. | |
| 2001/0017039 A1 | 8/2001 | Weimer | |
| 2005/0007725 A1 | 1/2005 | Miettinen et al. | |
| 2005/0061497 A1 | 3/2005 | Amaral et al. | |
| 2006/0078789 A1 | 4/2006 | Wegner | |

FOREIGN PATENT DOCUMENTS

| | | |
|---|---|---|
| DE | 195 14 548 C1 | 10/1996 |
| DE | 196 43 717 A1 | 4/1998 |
| DE | 100 09 521 A1 | 8/2001 |
| DE | 202 00 484 U1 | 6/2002 |
| DE | 102 23 782 A1 | 12/2003 |
| DE | 103 23 110 A1 | 12/2004 |
| DE | 103 93 583 T5 | 2/2006 |
| DE | 602 24 066 T2 | 11/2008 |
| EP | 0 177 225 A1 | 4/1986 |
| EP | 0 512 906 A1 | 11/1992 |
| EP | 1 328 022 B1 | 7/2003 |
| EP | 1 331 665 A1 | 7/2003 |
| EP | 1 336 518 A2 | 8/2003 |
| GB | 2 300 072 A | 10/1996 |
| WO | WO 03/031884 A2 | 4/2003 |
| WO | WO 2004/042302 A2 | 5/2004 |

* cited by examiner

APPARATUS FOR COOLING OF ELECTRICAL ELEMENTS

CROSS-REFERENCE TO RELATED PATENT APPLICATIONS

Germany Priority Application 10 2006 045 564.9, filed Sep. 25, 2006 including the specification, drawings, claims and abstract, is incorporated herein by reference in its entirety. European Patent Office Priority Application 07017195.4, filed Sep. 3, 2007 including the specification, drawings, claims and abstract, is incorporated herein by reference in its entirety.

BACKGROUND OF THE INVENTION

The invention relates to an apparatus for cooling of electrical elements and to a method for producing the apparatus.

EP 0 177 225 A1 describes an active cooling system for electrochemical cells, in which cylindrical rechargeable batteries are held between channels, which convey coolant, in thermal contact with the channels, with the channels at least partially surrounding the cylindrical side walls of the electrical rechargeable batteries. The channels collecting or distributor areas which are arranged at right angles to their profile. An apparatus such as this involves considerable effort during production, with large intermediate spaces remaining between the electrical rechargeable batteries, which spaces are not used for cooling and thus occupy unnecessary physical space.

SUMMARY OF THE INVENTION

The object of the invention is to specify an apparatus for cooling of electrical elements, which provides good cooling performance but occupies little physical space and is simple to produce.

The routing of the channel in the heat sink, which extends essentially parallel to the plane of the bottom surfaces, allows the heat sink to be produced easily, with few individual parts. Furthermore, the matching of the channel profile to the edges of the electrical elements optimizes the distribution of the cooling power, and therefore the total cooling power required for the given heat losses from the electrical elements.

In order to further optimize the physical space, the bottom surfaces of the electrical elements are adjacent to the heat sink. In this case, the elements generally do not touch the heat sink.

The heat sink advantageously has two opposite faces, with a plurality of electrical elements being held on each of the faces. This makes use of a given planar geometry of the heat sink for optimized use of the cooling power.

It is generally preferable for the electrical elements to be electrically isolated from the heat sink. In particular, this allows the electrical elements to be connected in series, therefore allowing a high operating voltage.

DETAILED DESCRIPTION OF THE PREFERRED EMBODIMENTS

In one preferred development, thermal guide bodies are arranged on the heat sink and are adjacent to the electrical elements, with the guide bodies extending essentially at right angles to the heat sink and making thermal contact with the electrical elements. This makes use of intermediate spaces which remain between the elements, in order to reduce the thermal resistance. In the interest of simple production and good thermal connection between the guide bodies and the heat sink, the guide bodies are in this case integrally connected to the heat sink, in particular by soldering. In a further preferred embodiment, at least some of the guide bodies are in the form of cups with an at least partially circumferential wall, with one electrical element in each case being held in one of the cup-shaped guide bodies. This allows an expedient combination of thermal heat dissipation with retention of the elements. Alternatively or additionally, at least some of the guide bodies are each in the form of a rod which is arranged between adjacent electrical elements, thus allowing optimized space utilization, with good heat dissipation from the side walls of the elements at the same time, particularly when the elements are cylindrical. Irrespective of the shape of the guide bodies, it is advantageous and in the interest of simple production and good and homogeneous heat dissipation, as well as good electrical isolation, for the elements to be integrally connected to the guide bodies, in particular by means of an encapsulation compound which encapsulates the elements. An encapsulation compound such as this is, for example, a plastic such as an epoxy resin which is advantageously provided with thermally conductive additives, in the interest of electrical isolation, for example ceramic powder.

It is generally preferable for the electrical elements to be essentially cylindrical, with one end surface of the cylinder corresponding to the bottom surface of the electrical element. Cylindrical elements such as these are the most widely used form of, for example, rechargeable batteries, with the thermal heat emission being passed particularly uniformly to the exterior, by virtue of the round side wall of the cylinder.

In order to optimize the physical space and the cooling power, the edges of the electrical elements correspond to the edges of the bottom surface of the elements, with the channel running adjacent to the edges of a plurality of elements, at least in places. In this case, the channel advantageously successively follows sections of the edges of a plurality of elements, with the direction of the channel changing alternately with the successive elements.

This increases the channel length per element, therefore improving the cooling performance. In one preferred embodiment, the profile of the channel along the edges may in this case be essentially in the form of part of a circle. Alternatively or additionally the channel may also have a zigzag profile.

In one alternative or additional embodiment, the channel has a profile which branches into at least two channel elements. Particularly in edge regions of the heat sink, in which the channel runs along only one side of the elements, such branching is worthwhile in order to distribute the cooling power uniformly. The at least two channel elements in this case preferably in total have approximately the same flow cross section as the channel before it branches.

In one preferred embodiment of the invention, the channel is milled into a plate-like metal part, in particular composed of aluminum. This allows a particularly complex channel profile.

Alternatively or additionally, the channel may also be in the form of a curved tube, in particular an extrusion-molded profile preferably with a plurality of chambers, thus allowing low-cost and simple production, as well as a large wall area per unit length of the channel.

Furthermore, the heat sink advantageously has at least two channels which, in particular, are connected in parallel. Depending on the size of the heat sink and the number of electrical elements, such parallel connection of channels is desirable in order to allow approximately the same cooling power to be provided as far as possible for all of the elements. In this context, it particularly advantageous for the at least two channels to be essentially of the same length. Particularly preferably, the length of the second channel in this case differs from the length of the first channel by no more than about 40%, particularly advantageously by no more than about 20%, in order to ensure uniform distribution of the cooling power over all of the elements. Alternatively or in addition to this, the at least two channels each have an essentially constant flow cross section, essentially of the same size. The flow cross section of the second channel preferably differs from the flow cross section of the first channel in this case by no more than about 30%, in particular by no more than about 15%. These measures also contribute to all of the electrical elements being provided with essentially the same cooling power.

In one advantageous embodiment, the electrical elements are rechargeable batteries, in particular lithium-ion batteries. In some circumstances, not only the performance but also the life of components such as these are significantly dependent on the operating temperature. These elements are therefore particularly suitable for combination with an apparatus according to the invention, since homogenization of the cooling power over the electrical elements has considerable influences on the maintenance intervals which, in the end, are governed by the electrical element with the shortest expected life.

The heat sink is particularly preferably connected to a cooling circuit of a climate control system for a motor vehicle, with the coolant being a coolant of the climate control system. This allows particularly low electrical element operating temperatures to be achieved, thus contributing to their life. This is particularly true of lithium-ion batteries in which even cooling to operating temperatures below typical surrounding temperatures can considerably improve the life. When the heat sink is connected to a climate control system, the coolant in the channel can flow through the heat sink both largely in the liquid phase, and, depending on the required cooling power, partially or completely with a phase change to the glass phase. This allows particularly rapid reaction to an increasing cooling power requirement.

In one preferred embodiment, the coolant is in this case R134a. However, it may also be some other coolant, such as carbon dioxide.

In one preferred detailed solution, the heat sink is arranged in the form of a parallel circuit in the cooling circuit. Particularly with an arrangement such as this, the heat sink can easily be integrated in existing cooling circuits in motor vehicles without having to modify their design to a major extent. Furthermore, the heat sink can be removed from the cooling circuit in a particularly simple manner if, for example, the electrical elements require little cooling power. In preferred circuitry, a supply of the coolant is in this case tapped off downstream from a collector of the cooling circuit, and particularly preferably upstream of an expansion member in the cooling circuit. An outlet for the coolant from the heat sink likewise preferably opens upstream of an evaporator in the cooling circuit and in particular downstream from an expansion member in the cooling circuit, in order to allow subsequent vaporization of coolant that is still liquid. In the interest of optimum cooling operation, an expansion member is arranged in series with the heat sink, upstream of the heat sink, with the expansion member in particular being in the form of a fixed constriction, in a low-cost design. However, alternatively, it may also be a thermostatic expansion valve.

In the interest of modular and low-cost design, a tap from the cooling circuit to the heat sink and an opening from the heat sink are in each case physically integrated in an expansion member in the cooling circuit. In particular this allows optional modular fitting of an apparatus according to the invention for the cooling circuit of a climate control system in a motor vehicle, at low cost. In this case, a conventional expansion member can be replaced by a physically integrated unit. Alternatively, the physically integrated unit may be provided, with the connections for the heat sink being sealed if the heat sink is not provided.

In a further advantageous detailed embodiment, the coolant flow through the heat sink can be varied by means of a valve which can be operated. By way of example, this may be a clocked solenoid valve, in which case the clock times are normally relatively long because of the thermal inertia of the systems and for reasons relating to the life of the solenoid valve. This makes it possible to vary the distribution of the cooling power and of the coolant mass flow between the heat sink and the conventional evaporator in the climate control system.

In one optimized embodiment, in particular for a climate control system in a motor vehicle, the channel has a length of less than about 1000 mm, in particular of about 650 mm. The flow cross section of the optimized embodiment of the channel is between about 5 mm$^2$ and about 170 mm$^2$, particularly preferably between about 30 mm$^2$ and about 50 mm$^2$. The total coolant flow through the optimized embodiment of the heat sink is between about 4 g/s and about 5 g/s. These orders of magnitude make it possible to achieve a cooling power of about 0.5 kW with the cooling power being distributed largely homogeneously over the elements. This complies with requirements for cooling electrical elements, in particular in passenger motor vehicles. By way of example, these are hybrid vehicles, which have an electrical drive in addition to an internal combustion engine, with the electrical elements representing an energy source for the electric motor.

In a further preferred exemplary embodiment, the heat sink is in the form of a stack formed from a plurality of elements which are in the form of plates. In consequence, the heat sink can be produced at particularly low cost. In the interest of simple production, the stack in this case preferably comprises a central plate part, with the central plate part, with the stack having an aperture in order to form the channel. Particularly in the case of channels with a complex shape, the central plate part may in this case comprise at least two separate segments which are not formed integrally. These segments are in this case expediently cut out in a single plate, in order to reduce the wastage of material.

In one advantageous development, the central plate part has a plurality of apertures, in particular circular apertures, with the apertures being arranged to coincide with the bottom surfaces of the electrical elements. This results in the provision of heat escape openings, which allow controlled bursting of the electrical elements in the event of overheating or other malfunctions. In addition, apertures such as these which are provided in addition to the channel reduce the weight of the heat sink.

It is generally advantageous to fix at least one cover plate on the central plate part, forming a seal. This allows the apertures which form the channel in the central plate part to be closed or completed in a simple manner to form the channel. In this case, the central plate part and the cover plate are particularly preferably soldered to one another over their area, thus allowing a particularly pressure-resistant connection to be formed with simple production, for example in a solder oven. In principle, however, some other form of integral fixing may also be provided, for example by means of an adhesive or else mechanical fixing, in particular by using sealants.

In one preferred embodiment, a further plate part is fixed on the face of the cover plate opposite the central plate part. A further plate part such as this can be designed in particular for retention and thermally conductive linking of guide bodies or else for mechanical positioning of the electrical elements.

In the interest of simple production, at least some of the elements which are in the form of plates are plated with solder over their area. This makes it possible, for example, for the mechanically prefitted parts of the heat sink to be integrally fixed to one another in a solder oven. In this case, the elements which are in the form of plates are preferably composed of a light-metal alloy, in particular based on aluminum. Components such as these can easily be soldered over their area, can be shaped at low cost and have low weight with good pressure resistance and good thermal conduction.

The object of the invention is also achieved by a production method having the steps according to Claim 45. A production method such as this is particularly cost effective and is suitable for automated production of large quantities of the apparatus according to the invention.

In one preferred embodiment of a production method, step c. comprises the cover parts being soldered over their area to the central plate part, in particular by introducing the parts which are in the form of plates and are arranged one on top of the other into a soldering oven.

Furthermore, the aperture can advantageously be incorporated in the central plate part by means of laser cutting, thus allowing complex channel routing with low production costs. As an alternative to this, the aperture can also be incorporated in the central plate part, however, by means of stamping, thus allowing a further cost reduction, particularly when manufacturing large quantities.

In one preferred development of the production method, a plurality of guide bodies which extend essentially at right angles to the central plate part are fitted in one method step, in particular by soldering. In this case, in order to improve the heat dissipation from the electrical elements, the guide bodies can likewise be fitted by means of solder plating, with the components of the heat sink being soldered in a solder oven after being mechanically assembled in advance.

A further reduction in the production costs is provided by a method step for positioning the electrical elements relative to the heat sink and application of an encapsulation compound between the elements and the heat sink. This makes it possible to avoid mechanical deformation and, in particular additional electrically isolating adaptors for positioning of the elements with respect to the heat sink.

The invention also relates to a motor vehicle, in particular a passenger motor vehicle, having the features of Claim 51. The apparatus according to the invention for cooling of the electrical elements is particularly highly suitable for use as an energy source for an electric propulsion motor for a passenger motor vehicle. In one particularly preferred embodiment, the motor vehicle has a hybrid drive comprising the electric motor and an internal combustion engine.

Further advantages and features of the invention will become evident from the exemplary embodiments described in the following text and from the dependent claims.

Further objects, features and advantages of the present invention will become apparent from the detailed description of preferred embodiments that follows, when considered together with the accompanying figures of drawing.

BRIEF DESCRIPTION OF THE DRAWINGS

A plurality of preferred exemplary embodiments of an apparatus according to the invention will be described in the following text, and will be explained in more detail with reference to the attached drawings, in which.

Figure 1:
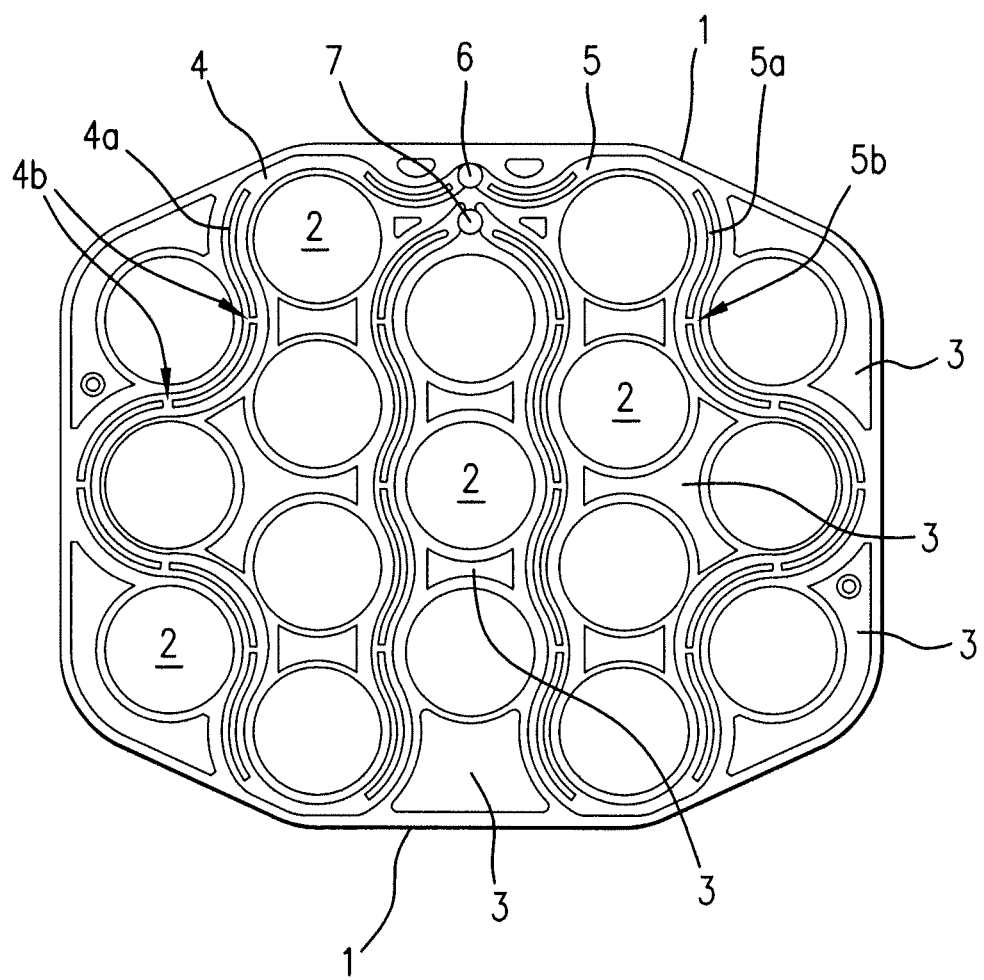
FIG. 1 shows a plan view of a partially assembled heat sink according to a first exemplary embodiment of the invention.

The first exemplary embodiment of the apparatus according to the invention as shown in FIG. 1 has a plate element composed of aluminum 1, on which a plurality of cylindrical electrical elements 2 are arranged. The electrical elements 2 are lithium-ion batteries whose bottom surfaces, facing the heat sink 1, are arranged on a plane, and which are each adjacent to the heat sink 1, but electrically isolated from it. For this purpose, holding rings or spiral surrounding windings composed of plastic (not illustrated) may be arranged between the aluminum heat sink 1 and the electrical elements 2. The lithium-ion batteries 2 have a thin metallically conductive outer wall, which is connected to one of the two battery poles. The same number of electrical elements are in each case arranged on each of the two opposite faces of the heat sink 1, which is in the form of a plate. There are a total of 34 electrical elements in the present case, 17 of which are arranged on each face of the heat sink. Two opposite electrical elements are in this case each aligned with their axes of symmetry. A circular aperture (not illustrated) is provided between each of these element pairs in the heat sink 1, thus on the one hand reducing the total weight of the apparatus and on the other hand creating an escape area for weak points, which are provided at the bottom of the elements 2, in the event of element failure.

A number of guide bodies 3 are provided between the elements 2 on each of the faces of the heat sink 1, which is in the form of a plate, and the height of these guide bodies 3 above the heat sink 1 corresponds approximately to the height of the electrical elements 2. The guide bodies 3 are composed of aluminum and are soldered to the heat sink 1, thus producing a good thermal contact between the guide bodies 3 and the heat sink 1. Depending on their arrangement between the electrical elements 2, the guide bodies 3 have different cross sections, with concave side surfaces of the guide elements 3 in the cylindrical outer walls of the electrical elements 2 being opposite, with an adequate safety gap for electric isolation. Once the apparatus has been completely assembled, the intermediate spaces between the guide body 3 and the electrical elements 2 are filled with a polymer encapsulation compound, which preferably has a ceramic powder added to it in order to improve its thermal conductivity. This results in each of the electrical elements 2 also making good thermal contact with the heat sink 1 and guide bodies 3, while being electrically isolated from these conductive components, and being mechanically secured. A considerable proportion of the heat is dissipated from the cylindrical side walls of the elements 2 through the encapsulation compound into the prismatic or rod-type guide bodies 3, in which the heat is passed to the heat sink, in the perpendicular direction as shown in FIG. 1.

The electrical isolation has a withstand voltage of at least about 1000 V. At least some of the electrical elements 2 in the apparatus are connected in series so that, despite small potential differences between the individual batteries, quite high maximum potential differences may occur between an electrical element and the heat sink 1.

A first channel 4 and a second channel 5 for carrying a coolant are incorporated in the heat sink 1 by milling, with the channels 4, 5 running on the same plane as the heat sink 1 and therefore also parallel to the bottom surfaces of the electrical elements 2. The channels 4, 5 run with an alternate curvature direction in places immediately adjacent to the edges of the circular bottom surfaces of the elements 2, thus improving the heat dissipation from the elements 2.

The channels 4, 5 each have the same length, of about 650 mm. A common inlet 6 for the coolant and a common outlet 7 for the coolant are provided at each of the ends of the channels 4, 5. The channels 4, 5 have essentially the same flow cross section of a total of about 40 mm$^2$ over their entire length, with each of the two channels 4, 5 having the same flow cross section of about 20 mm$^2$.

In the present case, a rib 4a, 5a is provided in the centre of each of the two channels 4, 5, which is continuous over the entire length of the channel, but has an interruption 4b, 5b approximately every 100 mm in order to allow thorough mixing of the coolant on the two channel sides. The ribs 4a, 5a enlarge the thermal contact area per channel length between the coolant and the channel wall.

For the purposes of the invention, a coolant should be understood in the present case as meaning fluid which can flow and transports heat. Inter alia, the coolant may be a coolant of a cooling circuit such as a climate control system.

An upper cover plate for the channels 4, 5 and the heat sink 1 is not illustrated in the schematic illustration in FIG. 1. This cover plate can, in particular, be soldered over its area to the illustrated plate part during production of the heat sink 1. The heat sink 1 is expediently produced from solder-plated aluminum parts which, after appropriate manufacturing steps such as milling up the channels 4, 5, fitting the cover plate which is not illustrated, and fitting the guide bodies 3, for example by means of an interference fit in suitable holes in the preassembled arrangement, can be placed in its entirely in a solder oven in order to be soldered to one another over their area, there.

The heat sink 1 is connected by means of its connection 6 on the inlet side and its connection 7 on the outlet side to the cooling circuit of a climate control system in a passenger motor vehicle with a hybrid drive, with an electric motor for the hybrid drive being supplied with electrical energy from the lithium-ion batteries 2.

Figure 8:
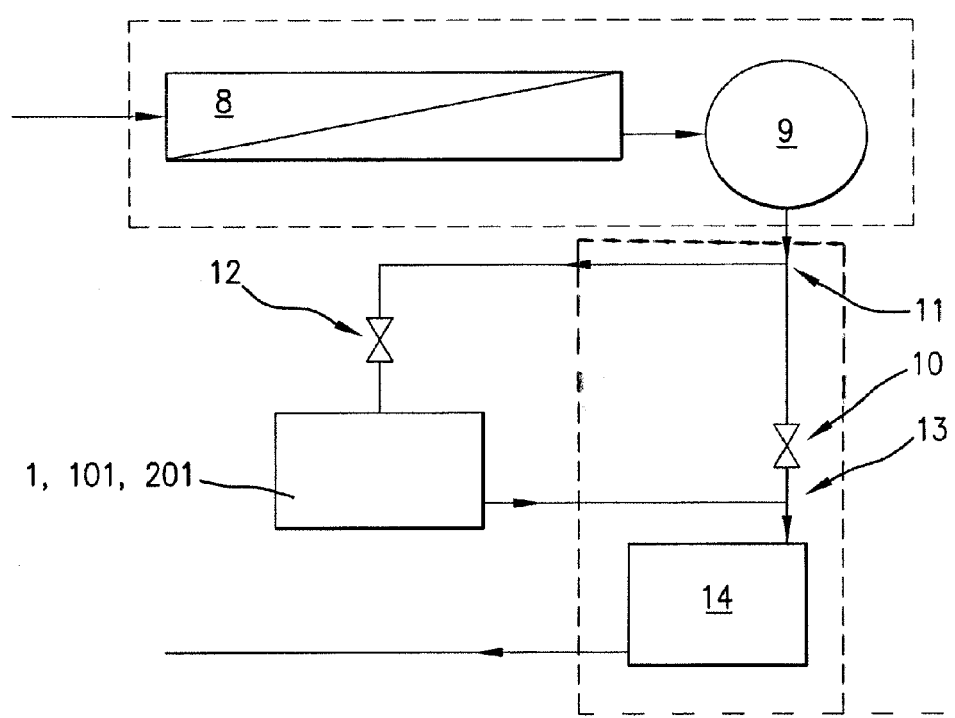
FIG. 8 shows a schematic illustration of a cooling circuit with an integrated apparatus according to the invention.

FIG. 8 schematically illustrates the integration of the heat sink 1 in a conventional cooling circuit with the coolant R134a. The cooling circuit has a compressor, which is not illustrated, followed by a condenser 8 and a collector 9, which is integrated with this in one unit. A line leads from the collector 9 to an expansion member 10 in the cooling circuit, with a tap 11 being provided upstream of the expansion member 10. A line leads from the tap 11 to a fixed constriction 12, which represents a dedicated expansion member for the heat sink 1. The coolant is passed from the fixed constriction 12 to the inlet opening 6 of the heat sink 1, after which it passes through the two channels 4, 5. The coolant is passed from the outlet opening 7 to a tap 13 of the cooling circuit, via which it opens into the cooling circuit again, underneath the expansion member 10. The tap 13 is followed in the known manner by an evaporator for the cooling circuit via which, for example, the air inside the vehicle can be conditioned.

The tap 11, the expansion member 10 and the tap 13 are expediently in the form of a physical unit, so that the heat sink 1 can be integrated as an additional module in existing cooling circuits, with all that is required being to replace the expansion member with the integrated taps. If the cooling circuit in the motor vehicle is a $CO_2$ climate control system ($CO_2$ or R744 as the coolant), when the tapping of the coolant to the heat sink expediently takes place downstream from an inner heat exchanger in the $CO_2$ cooling circuit.

Figure 2:
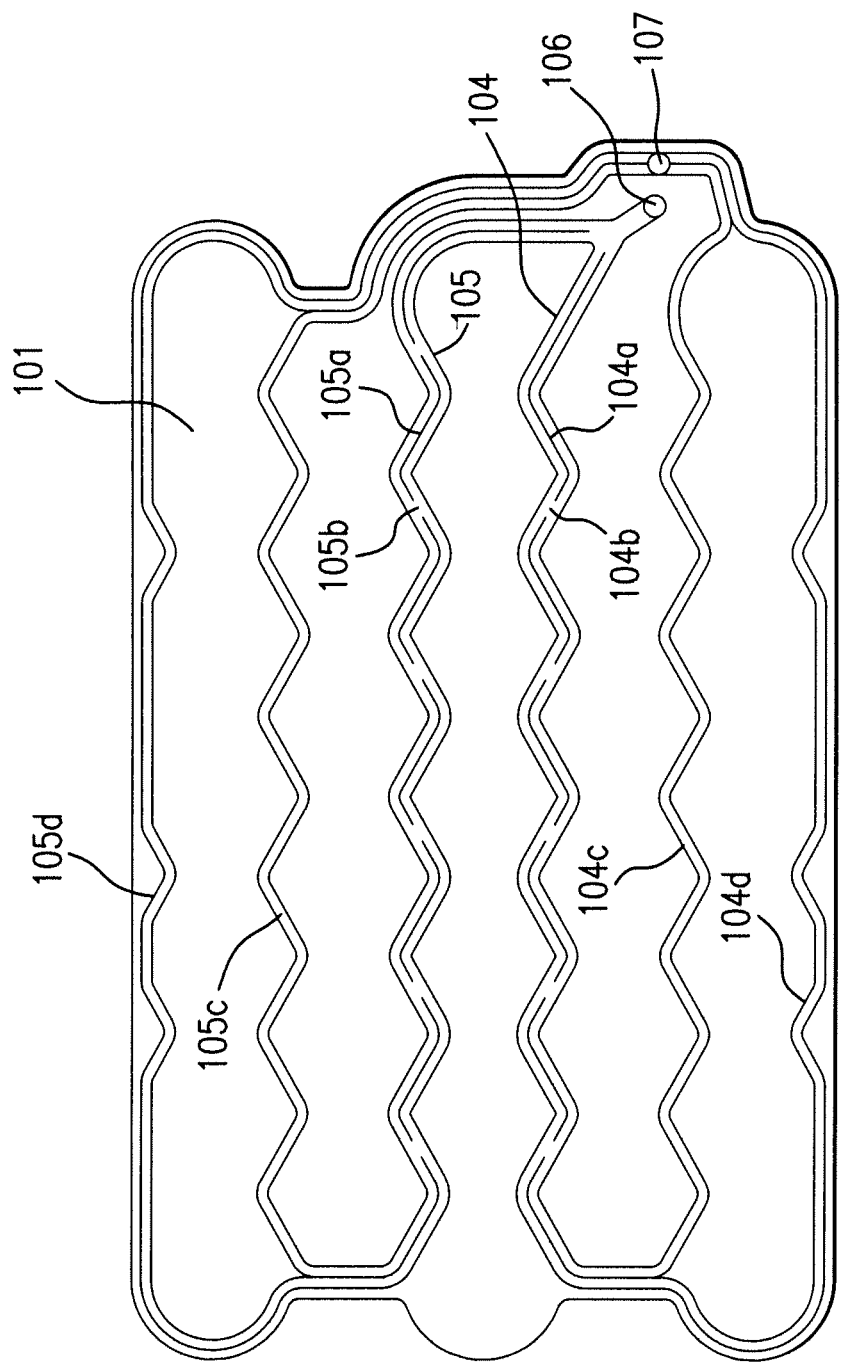
FIG. 2 shows a schematic plan view of the heat sink of an apparatus according to the invention, according to a second exemplary embodiment.

In the second exemplary embodiment shown in FIG. 2, a heat sink 101 is provided which, in contrast to the first exemplary embodiment, has electrical elements on only one face. A first channel 104 and a second channel 105 branch off, starting from an inlet 106 for the coolant. Each of the channels 104, 105 first of all runs in a zigzag shape over a longitudinal direction of the heat sink 101, with an electrical element (not illustrated) in each case being arranged between zigzag sections of the channels 104 and 105 which are at the same height. In a similar manner to the first exemplary embodiment, each of the channels 104, 105 has rib elements 104a, 105a in its center on this first section, with interruptions 104b, 105b, in order to improve the heat exchange process. After passing through the heat sink 101 along its longitudinal direction, each of the channels 104, 105 branches off into a first channel element 104c, 105c, and into a second channel element 104d, 105d. The channel elements 104c, 104d, 105c, 105d run back in a corresponding zigzag shape along the heat sink 101, and are each joined together again to form a common channel, shortly before their end, opening in a common outlet 107 for the coolant.

As can be seen, the channel routing as shown in FIG. 2 is designed such that a total of 33 cylindrical electrical elements can be arranged with their bottom faces facing the heat sink 101 in the suitable intermediate spaces between the zigzag channel profiles, with a row of 7 elements and a row of 6 elements in each case being provided, alternately, offset with respect to one another. The heat sink 101 in the second exemplary embodiment is therefore designed to cool approximately the same number of electrical elements as the heat sink 1 in the first exemplary embodiment.

Figure 3:
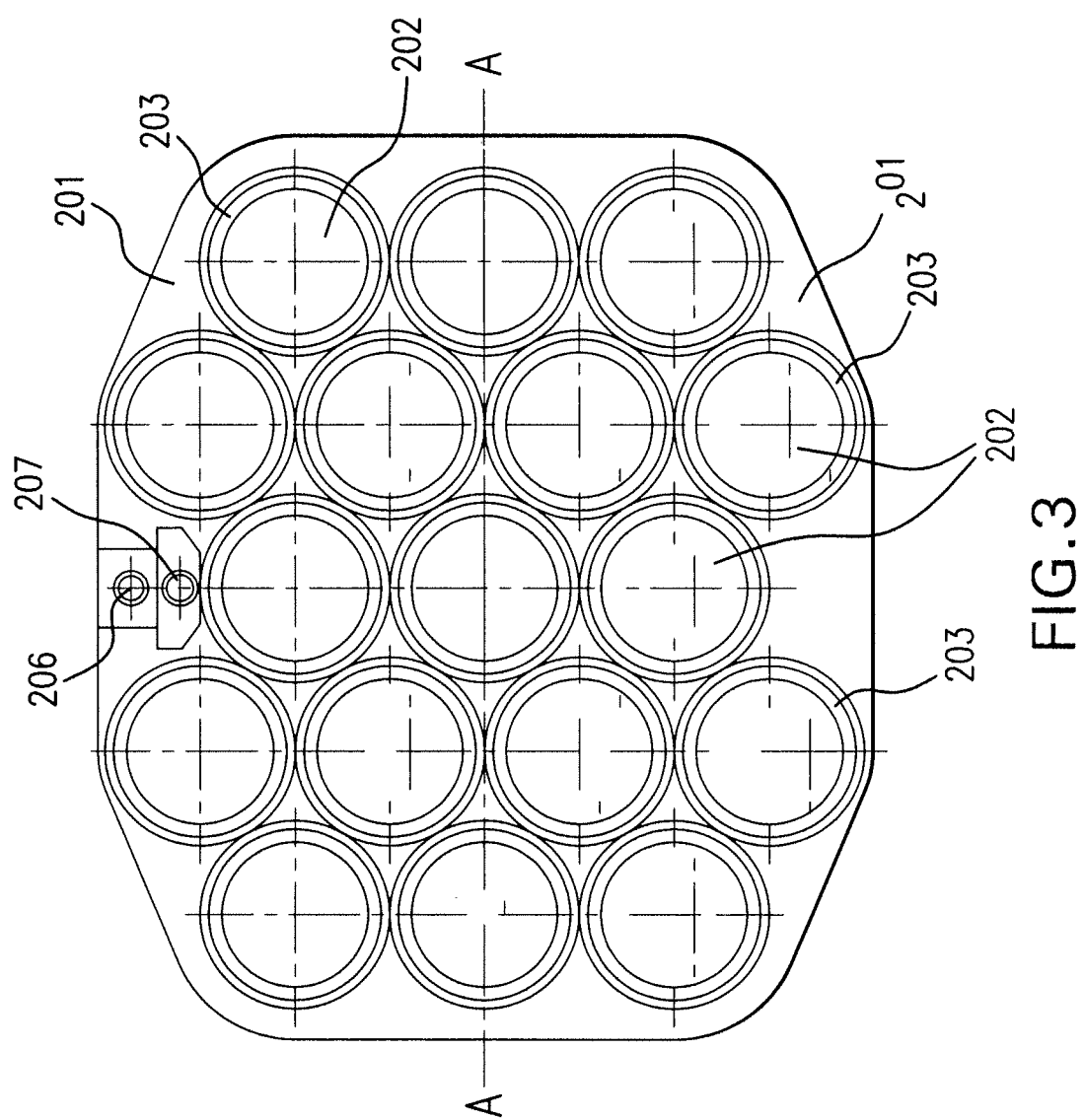
FIG. 3 shows a plan view of a third exemplary embodiment of an apparatus according to the invention.

The spatial arrangement of the electrical elements 202 in the third exemplary embodiment shown in FIG. 3 is the same as that in the first exemplary embodiment shown in FIG. 1. One difference from the first exemplary embodiment is that guide bodies 203 in the third exemplary embodiment are in the form of cylindrical, cup-shaped walls, within each of which an electrical element 202 is arranged.

Figure 4:
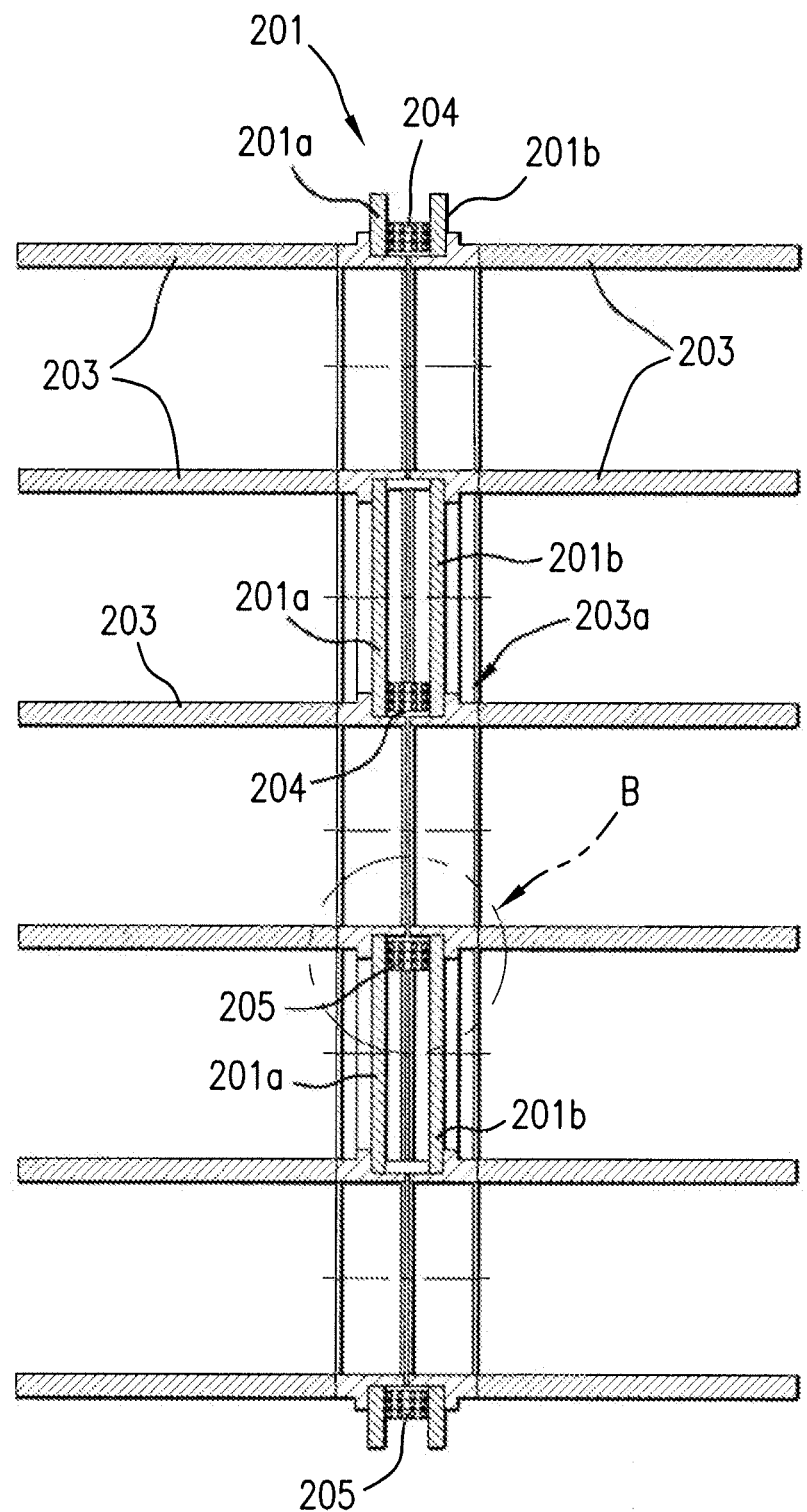
FIG. 4 shows a section view of the embodiment shown in FIG. 3, along the line A-A.
Figure 5:
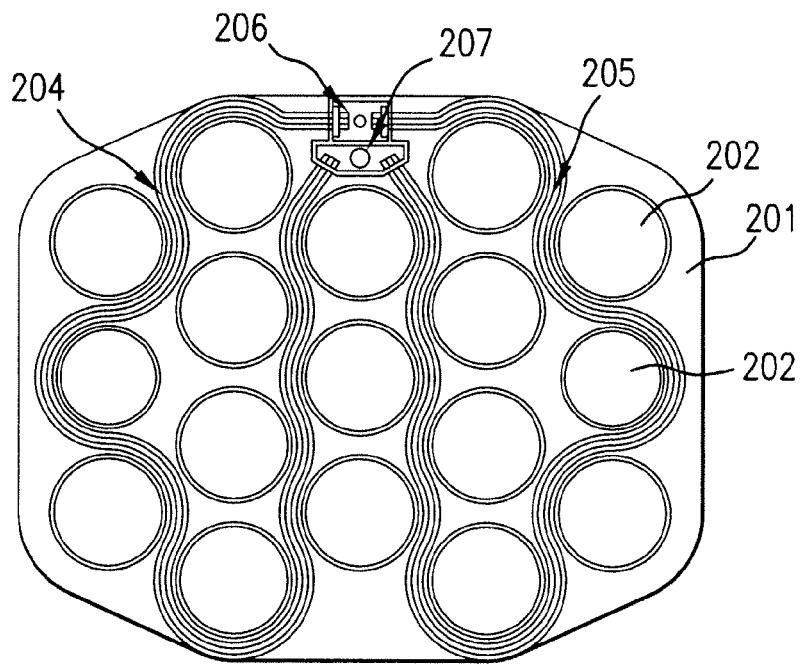
FIG. 5 shows a plan view of the apparatus shown in FIG. 3, in a partially assembled state.

As can be seen from the section view in FIG. 4, the heat sink 201 has two parallel aluminum plates 201a, 201b which form opposite faces of the heat sink 202 and have congruent circular apertures for each opposite pair of electrical elements 202.

The guide bodies 203 are rotationally symmetrical cup parts composed of aluminum, which are inserted by means of steps 203a into the circular apertures in the plates 201a, 201b and are soldered over their area to the edges of the apertures.

Two multichamber tubes 204, 205 are arranged between the two plates 201a, 201b and are bent a plurality of times on the plane of the plates, and on the bottom surfaces of the electrical elements, so that they have a profile on the heat sink plane which largely corresponds to the profile of the channels 4, 5 in the first exemplary embodiment.

Figure 6:
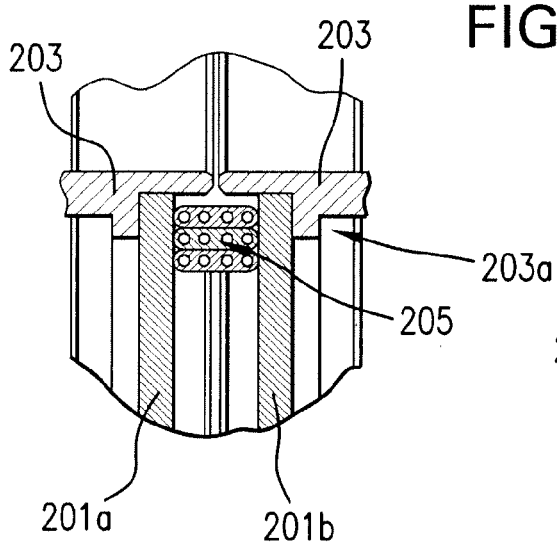
FIG. 6 shows an enlargement of the detail in the area B shown in FIG. 4.
Figure 7:
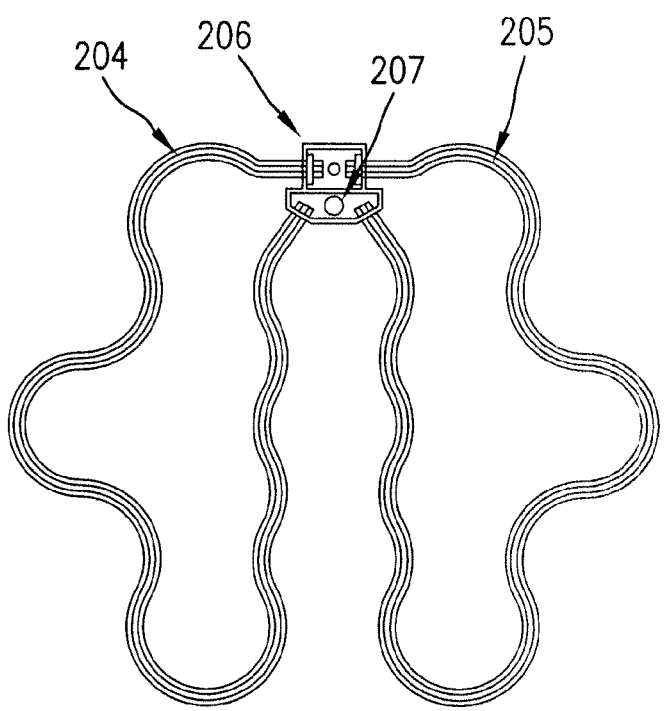
FIG. 7 shows an illustration of a two-element channel of the apparatus shown in FIG. 5.

As shown in the illustrations in FIG. 4, FIG. 6 and FIG. 7, each of the multichamber tubes 204, 205 is in the form of a group of three flat tubes with an extrusion-molded profile, with four separate chambers with circular cross section being provided in each of the extrusion-molded profiles. The group of three flat tubes allow easy bending; alternatively, for example, just one single channel tube or else a different arrangement of chambers provided therein can be provided, depending on what is expedient. The tubes need not necessarily be extrusion-molded profiles.

The channels or curved extrusion-molded profiles 204, 205 are each connected to one another on the inlet side via a connection piece 206, and on the outlet side via a connection piece 207.

The heat sink 201 in the third exemplary embodiment is produced in the same way as in the first exemplary embodiment by means of solder-plated aluminum parts, which are first of all mechanically preassembled and are then jointly soldered to one another in a solder oven, over as large an area as possible. In particular the plate elements 201a, 201b may be solder-plated, thus allowing both the guide bodies 203 and the channel tubes 204, 205 to be soldered, without any additional method steps for solder plating of these components 203, 204, 205.

In the case of the third exemplary embodiment, the electrical elements 202 are arranged within the cup-shaped guide bodies 203. Spacing rings composed of electrically insulating plastic or ceramic can expediently be provided for positioning of the electrical elements within the cup parts, with a remaining intermediate space between the cup guide bodies 203 and the electrical elements 202 being encapsulated by means of a polymer encapsulation compound in order to hold the electrical elements and to ensure electrical isolation.

The intermediate spaces between adjacent guide bodies 203 can also optionally be encapsulated with encapsulation compound, if it is desired to provide particularly good homogenization of the temperature distribution and cooling power over the apparatus.

Figure 9:
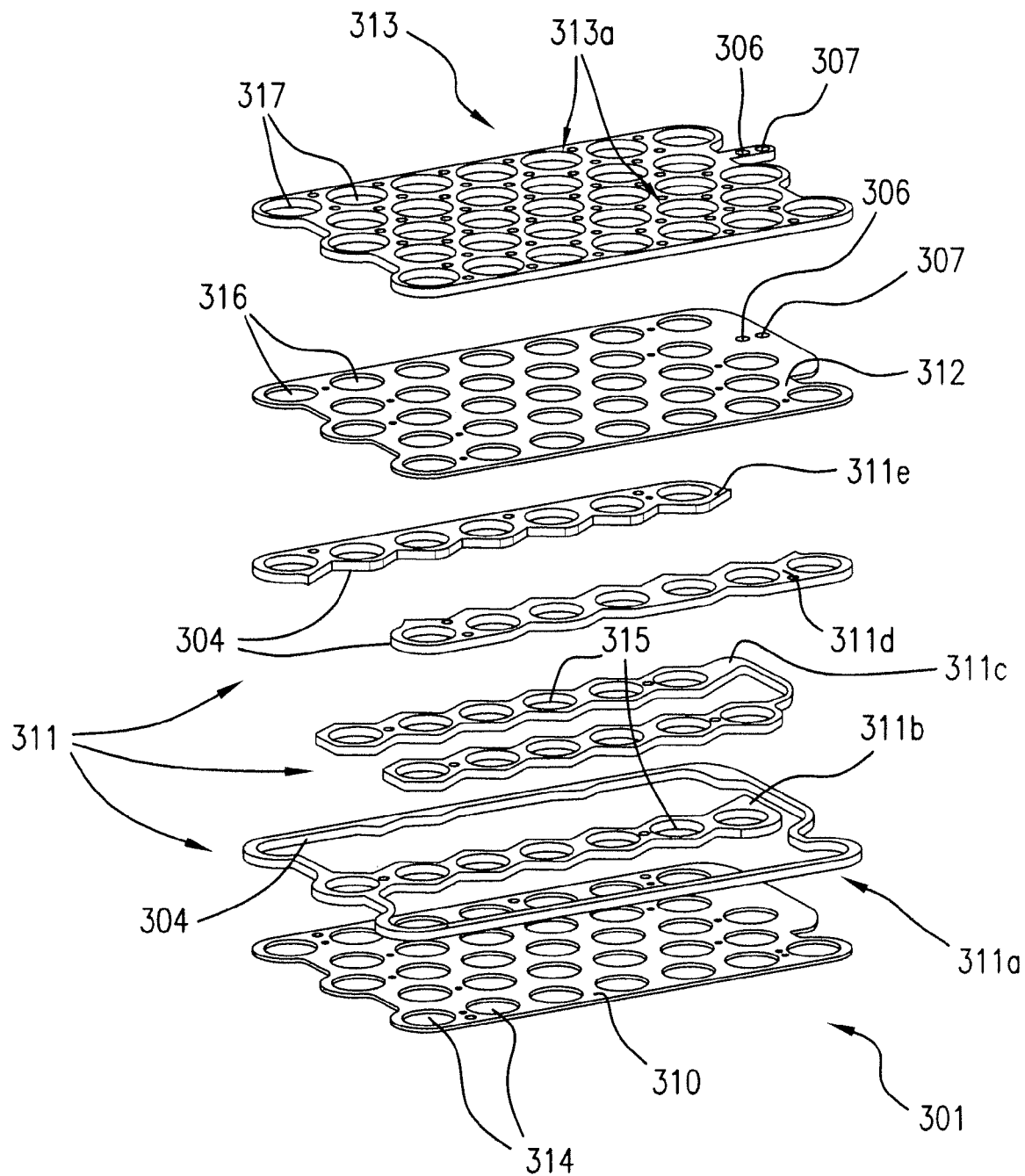
FIG. 9 shows a three-dimensional exploded illustration of a fourth exemplary embodiment according to the invention.

FIG. 9 illustrates a further exemplary embodiment. The heat sink 301 has a plurality of elements which are in the form of plates, specifically a lower cover plate 310, a central plate part 311 which is fitted on the lower cover plate, an upper cover plate 312 which is fitted on the central plate part, and a further plate part 313 which is fitted on the upper cover plate.

The central plate part 311 is composed of a plurality of separate segments 311a to 311e, which are positioned alongside one another on the same plane. A first segment 311a forms a closed circumferential edge, with the other segments 311b to 311e being arranged within this edge. In this case, an aperture 304 is left between the edges of the segments 311a to 311e, and forms the channel for carrying the coolant. The profile of the channel 304 in this case corresponds essentially to that of the exemplary embodiment shown in FIG. 2. The arrangement and number of electrical elements (not illustrated) likewise correspond to this exemplary embodiment.

The apertures 304 are covered by the arrangement of the upper and lower cover plates 310, 312, and are therefore closed to form the coolant channel.

Both the central plate part 311 and the cover plates 310, 312 also have a number of circular apertures 314, 315, 316, which are aligned with one another. These apertures provide escape areas or bursting openings, into which the electrical elements can burst in the event of a corresponding malfunction. The electrical elements are arranged with their bottom surfaces above the bursting openings, with the bottom surfaces being provided with a weak point. Furthermore, a contact runs within the elements in the area of the weak point, so that bursting of the bottom as a result of heating and/or pressure at the same time leads to the circuit of the relevant element being interrupted. Furthermore, the apertures 314, 315, 316 result in a reduction in the weight of the heat sink.

A further plate part 313 is arranged flat on the upper cover plate 312 and has a corresponding number of congruent circular apertures 317. The diameter of the apertures 317 is somewhat larger than that of the other apertures 314, 315 and 316, since the further plate part 313 need not cover the coolant channels 304.

The further plate part 313 is somewhat thicker than the upper cover part 312, and has a row of holes 313a to hold guide bodies (not illustrated). These guide bodies are prismatic and extend at right angles to the plane of the heat sink 301. They are arranged between the electrical elements and improve the heat dissipation from the elements to the heat sink. In principle, the guide bodies (which are not illustrated) correspond to the guide bodies 3 in the first exemplary embodiment (FIG. 1).

For connection to a supply line and output line for the coolant, the upper cover plate 312 and the further plate part 313 each have aligned holes 306, 307, which are respectively connected to opposite ends of the channel 304 (in a similar manner to the connections 106, 107 in FIG. 2).

All of the parts 310, 311, 312, 312 which are in the form of plates as well as the guide bodies, which are not illustrated, are composed of an aluminum alloy. The central plate part 311 is solder-plated on both sides, and the further plate part 313 is solder-plated at least on its face facing the upper cover plate. In order to fix the guide bodies, the guide bodies and/or that side of the further plate part 313 which faces the guide bodies are/is solder-plated. This allows the apparatus to be produced easily, since the parts can be mechanically positioned with respect to one another, for example for holding them by brackets, and can then be soldered to one another over their area in a solder oven.

The central plate part typically has a thickness of around 5 mm, with its length being about 60 cm and its width about 30 cm. The illustration in FIG. 9 is essentially true to scale. The apertures and their edges 304, 315, 314, 316, 317 may be produced in various ways, for example by laser cutting or by stamping. A multistage stamping process may be used in order, if necessary, to take account of a corresponding thickness of the part which is in the form of a plate. In particular, it is possible to produce the apertures in the thinner cover plates 310, 312 by stamping, and to produce the apertures in at least one of the thicker plates 311, 313 by laser cutting or some other suitable forming method.

Once the heat sink 301, which in the present case is composed completely of light alloy, has been produced as described above, the electrical elements are arranged and fixed. For this purpose, the cylindrical elements present (not illustrated) are positioned by means of a suitable holding apparatus with their bottom surfaces a short distance away from the uppermost plate part 313, and are positioned between the guide bodies, without any contact at any point. In a similar way to that in the first exemplary embodiment, an electrically insulating and thermally conductive encapsulation compound is then applied, and fills the space between the electrical elements on the one hand and the heat sink 301 on the other hand. The circular bursting openings are not filled during this process.

It is self-evident that the heat sink may have electrical elements on both sides, in a similar manner to that in FIG. 4. A further plate, which corresponds to the plate part 313, and has guide bodies, could be arranged on the lower cover plate 310 for this purpose.

As can be seen from FIG. 1 to FIG. 7 and FIG. 9, all the described exemplary embodiments are expediently connected by their coolant connections to a climate control system in a motor vehicle, with the parallel connection as described above and as illustrated in FIG. 8 being particularly expedient. The distribution of the coolant flows between the heat sink and a conventional evaporator in the climate control system can be influenced by means of a switching valve that is not illustrated, for example a clocked solenoid valve.

Alternatively, a dedicated cooling circuit can also be provided for the apparatus, operating independently from a climate control system in the motor vehicle.

The channels each have an optimized length and an optimized flow cross section for optimum linking to a cooling circuit. This leads to a coolant flow from a typical cooling circuit which is designed for a passenger motor vehicle flowing through the channels such that complete vaporization without excessive overheating occurs when the demand for cooling power by the electrical elements is at a maximum. If no cooling power, or only a small amount of cooling power, is required by the electrical elements, then the coolant can continue to flow through the channels without evaporation or with only a small amount of evaporation, following which it is still available for evaporation in an evaporator of the climate control system in the vehicle.

For this purpose, the channels in particular have a homogeneous flow cross section, avoiding side arms or bulges through which no flow passes and which could act as traps for the oil circulating in the climate control circuit. The proposed embodiments with the stated channel dimensions are all designed for the situation when the coolant R134a is used in conjunction with typical climate control systems for passenger motor vehicles, such that the entire mass flow of the coolant is about 4 to 5 g/s. When the vaporization heat is used in practice, this results in a heat dissipation of about 400 to 500 W. A mass-flow density of about $120 \text{ kg/m}^2$ s is achieved for the given total flow cross sections of the channels of about $40 \text{ mm}^2$. This mass-flow density is about 50% greater than an experimentally determined lower limit to ensure the desired heat dissipation. This excess mass-flow density of coolant is introduced, inter alia, for the reason that the desired minimum cooling power is achieved as independently as possible of the spatial position of the apparatus and disadvantageous influences of the force of gravity on the coolant flow.

It is self-evident that the particular features of the various exemplary embodiments can be combined with one another as required.

The foregoing description of preferred embodiments of the invention has been presented for purposes of illustration and description only. It is not intended to be exhaustive or to limit the invention to the precise form disclosed, and modifications and variations are possible and/or would be apparent in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and that the claims encompass all embodiments of the invention, including the disclosed embodiments and their equivalents.

What is claimed is:

1. A heat sink for cooling cylindrical electrical elements each having a circular end face, the heat sink comprising:
    a heat-conducting plate having first and second sides, a single coolant inlet, a single coolant outlet, and a first plurality of bores arranged on the first side of the heat-conducting plate, each of the first plurality of bores being configured to receive a cylindrical end portion of one of the cylindrical electrical elements, the first plurality of bores each including an axis of symmetry and a bore bottom wall;
    at least one serpentine channel formed in the plate running past multiple ones of the first plurality of bores in a plane perpendicular to said axes of symmetry, the serpentine channel including curved portions following the curvature of the bores,
    wherein the at least one serpentine channel runs uninterrupted from the coolant inlet to the coolant outlet, and
    wherein the coolant inlet, the coolant outlet and the entire at least one serpentine channel are formed in the first side of the heat-conducting plate.

2. Apparatus according to claim 1, wherein the end faces of the electrical elements are adjacent to the heat sink.

3. Apparatus according to claim 1, including a plurality of electrical elements, wherein the electrical elements are electrically isolated from the heat sink.

4. Apparatus according to claim 1, including a plurality of electrical elements, wherein guide bodies are arranged on the heat conducting plate and are adjacent to the electrical elements, with the guide bodies extending essentially at right angles to the heat conducting plate and making thermal contact with the electrical elements.

5. Apparatus according to claim 4, wherein the guide bodies are integrally connected to the heat conducting plate by soldering.

6. Apparatus according to claim 4, wherein at least some of the guide bodies are in the form of cups with an at least partially circumferential wall, with one electrical element in each case being held in one of the cup-shaped guide bodies.

7. Apparatus according to claim 4, wherein at least some of the guide bodies are each in the form of a rod which is arranged between adjacent electrical elements.

8. Apparatus according to claim 4, wherein the electrical elements are integrally connected to the guide bodies by an encapsulation compound which encapsulates the elements.

9. Apparatus according to claim 1, including a plurality of electrical elements, wherein the electrical elements are essentially cylindrical, with one end surface of the cylinder corresponding to the bottom surface of the electrical element.

10. Apparatus according to claim 1, wherein a profile of the channel along the edges is essentially in the form of part of a circle.

11. Apparatus according to claim 1, wherein the channel has a profile which branches into at least two channel elements.

12. Apparatus according to claim 11, wherein the at least two channel elements in total have approximately the same flow cross section as the channel before it branches.

13. Apparatus according to claim 1, wherein the channel is milled into the heat-conducting plate and wherein the heat-conducting plate is composed of aluminum.

14. Apparatus according to claim 1, wherein the heat sink comprises at least two channels connected in parallel.

15. Apparatus according to claim 14, wherein the at least two channels are essentially of the same length.

16. Apparatus according to claim 15, wherein the length of the second channel differs from the length of the first channel by no more than about 40%.

17. Apparatus according to claim 14, wherein the at least two channels each have an essentially constant flow cross section of essentially the same size.

18. Apparatus according to claim 17, wherein the flow cross section of the second channel differs from the flow cross section of the first channel by no more than about 30%.

19. Apparatus according to claim 1, wherein the electrical elements are rechargeable batteries.

20. Apparatus according to claim 1, wherein the heat sink is connected to a cooling circuit of a climate control system in a motor vehicle, with the coolant being a coolant of the climate control system.

21. Apparatus according to claim 20, wherein the coolant is R134a.

22. Apparatus according to claim 20, wherein the heat sink is arranged in the form of a parallel circuit in the cooling circuit.

23. Apparatus according to claim 22, wherein a supply of the coolant is tapped off downstream from a collector and upstream of an expansion member in the cooling circuit.

24. Apparatus according to claim 22, wherein an outlet for the coolant from the heat sink opens upstream of an evaporator in the cooling circuit and downstream from an expansion member in the cooling circuit.

25. Apparatus according to claims 22, wherein a supply to the heat sink and an opening from the heat sink are each physically integrated in an expansion member in the cooling circuit.

26. Apparatus according to claim 20, wherein an expansion member is arranged in series with the heat sink, upstream of the heat sink, with the expansion member being in the form of a fixed constriction.

27. Apparatus according to claim 20, wherein the coolant flow through the heat sink can be varied by means of a valve which can be operated.

28. Apparatus according to claim 20, wherein the channel has a length of less than about 1000 mm.

29. Apparatus according to claim 20, wherein the channel has a flow cross section between about 5 mm$^2$ and about 170 mm$^2$.

30. Apparatus according to claim 20, wherein the total coolant flow through the heat sink is between about 4 g/s and about 5 g/s.

31. Motor vehicle having at least one electric motor for propulsion of the motor vehicle, and an apparatus according to claim 1, with the electric motor drawing at least part of its drive energy from electrical elements mounted in the heat-conducting plate.

32. Motor vehicle according to claim 31, wherein the motor vehicle has a hybrid drive comprising the electric motor and an internal combustion engine.

33. Heat sink according to claim 1, wherein the second side includes a second plurality of bores, each of the second plurality of bores being configured to receive a cylindrical end portion of one of the cylindrical electrical elements, the second plurality of bores each including an axis of symmetry and a bore bottom wall.

34. Heat sink according to claim 33, wherein the axes of symmetry of the second plurality of bores are aligned with the axes of symmetry of the first plurality of bores.

35. Heat sink according to claim 33 including apertures connecting a set of bores of the first plurality of bores to a set of bores of the second plurality of bores.

36. Heat sink according to claim 33 including a first plurality of cylindrical electrical elements mounted in said first plurality of bores.

37. Heat sink according to claim 1, including a plurality of guide bodies projecting away from the plate between pairs of bores in locations spaced from the at least one serpentine channel, the guide bodies extending essentially at right angles to the heat sink and configured to make thermal contact with the electrical elements mounted in the bores.

38. A heat sink for cooling cylindrical electrical elements each having a circular end face, the heat sink comprising:
a heat-conducting plate having first and second sides and a first plurality of bores arranged on the first side, each of the first plurality of bores being configured to receive a cylindrical end portion of one of the cylindrical electrical elements, the first plurality of bores each including an axis of symmetry and a bore bottom wall and including a first plurality of cylindrical electrical elements mounted in said first plurality of bores;
at least one serpentine channel formed in the plate running past multiple ones of the first plurality of bores in a plane perpendicular to said axes of symmetry, the serpentine channel including curved portions following the curvature of the bores,
wherein the second side includes a second plurality of bores, each of the second plurality of bores being configured to receive a cylindrical end portion of one of the cylindrical electrical elements, the second plurality of bores each including an axis of symmetry and a bore bottom wall, and
wherein the first plurality of cylindrical electrical elements project away from the plate in a first direction and including a second plurality of electrical elements in the second plurality of bores, the second plurality of electrical elements projecting away from the plate in a second direction opposite the first direction.

39. Apparatus according to claim 38, wherein the channel is in the form of a curved tube, or an extrusion-molded profile with a plurality of chambers.

40. Apparatus according to claim 38, wherein the heat sink is in the form of a stack formed from a plurality of elements in the form of plates.

41. Apparatus according to claim 40, wherein the stack has a central plate part, with the central plate part having an aperture in order to form the channel.

42. Apparatus according to claim 41, wherein the central plate part has at least two separate segments which are not integrally formed.

43. Apparatus according to claim 41, wherein the central plate part has a plurality of apertures in particular circular apertures, with the apertures being arranged to coincide with the bottom surfaces of the electrical elements.

44. Apparatus according to claim 41, wherein at least one cover plate is fixed on the central plate part, forming a seal.

45. Apparatus according to claim 44, wherein the central plate part and the cover plate are soldered to one another over their area.

46. Apparatus according to claim 44, wherein a further plate part is fixed on the face of the cover plate opposite the central plate part.

47. Apparatus according to claim 40, wherein at least some of the elements which are in the form of plates are plated with solder over their area.

48. Apparatus according to claim 40, wherein the elements which are in the form of plates are composed of a light-metal alloy, in particular based on aluminum.

* * * * *